Aug. 5, 1958 D. A. JENNY 2,846,340

SEMICONDUCTOR DEVICES AND METHOD OF MAKING SAME

Filed June 18, 1956

INVENTOR.
Dietrich A. Jenny
BY J. C. Whittaker
ATTORNEY

United States Patent Office 2,846,340

Patented Aug. 5, 1958

2,846,340

SEMICONDUCTOR DEVICES AND METHOD OF MAKING SAME

Dietrich A. Jenny, Princeton, N. J., assignor to Radio Corporation of America, a corporation of Delaware Application June 18, 1956, Serial No. 591,824

10 Claims. (Cl. 148—1.5)

Figures 1A, 1B, 1C, 1D, 1E, 1F, 2:
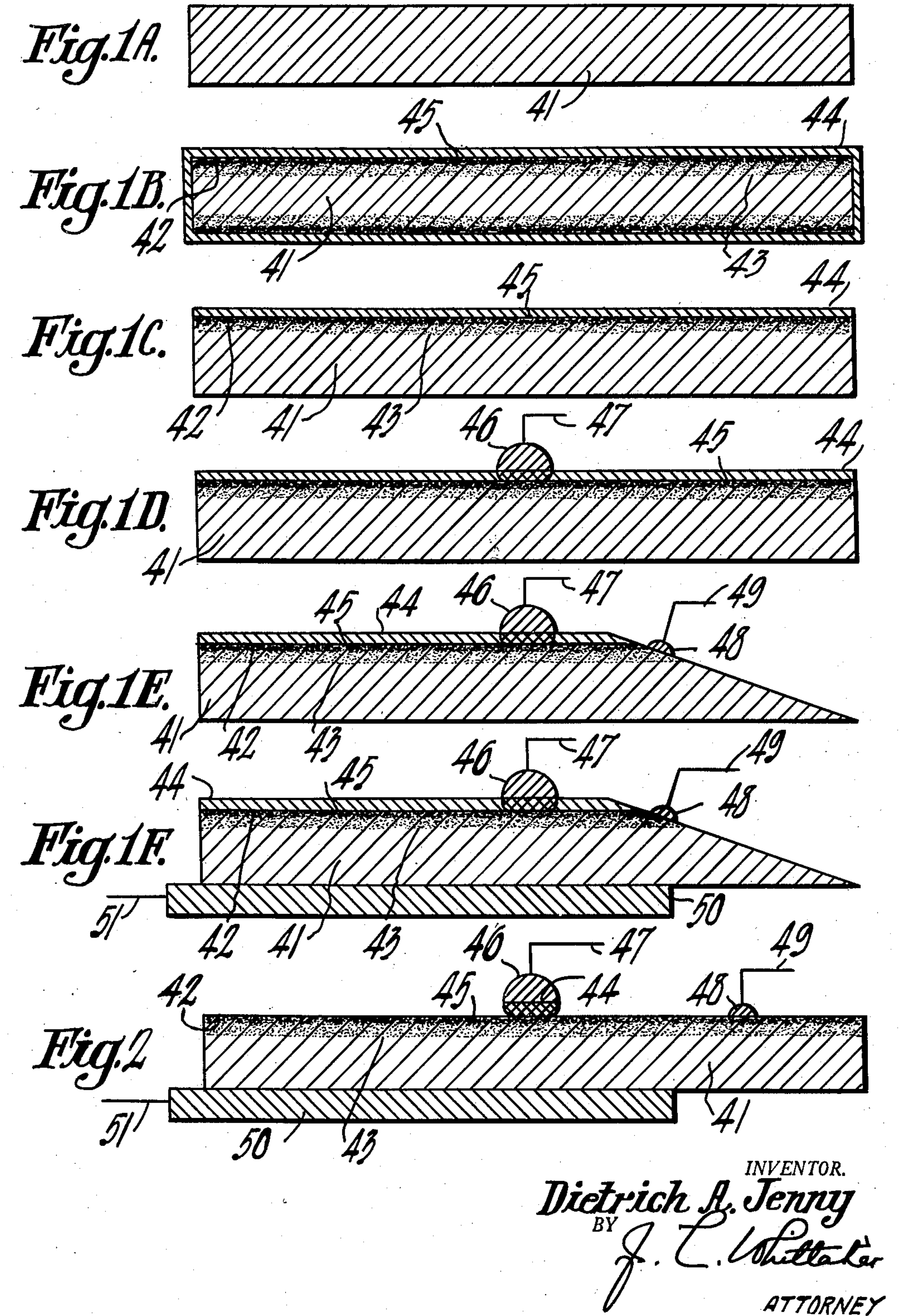

This invention relates to improved semiconductor devices. More particularly, the invention relates to improved devices utilizing compound semiconductive materials.

In the art of making electrical devices such as transistors, the semiconductive materials most often used are elemental germanium and silicon. Certain solid compounds also exhibit useful semiconductive properties. Examples are the phosphides, arsensides, and antimonides of aluminum, gallium, and indium. These are known as III–V compounds because they are made of elements from those columns of the periodic table. These solid semiconductive compounds have certain advantages over conventional materials such as silicon and germanium. The mobility of negative charge carriers is usually much greater in most of these compounds than it is in germanium or silicon. However, it has been found difficult to fabricate satisfactory transistors of these compound semiconductors.

If a transistor is made in which the emitter semiconductive material has a higher bandgap than the base semiconductive material, the unit has an emitter efficiency which is greater than that available when the emitter-base rectifying barrier is formed by homogeneous bandgap materials. See for example article by H. Kroemer, Zur Theorie des Diffusions und des Drift-Transistors III, A. E. V. 8 (1954), 499–504. The band-gap is the forbidden energy gap between the valence band and the conduction band of the semiconductor. It has also been shown that a transistor in which the concentration of impurity in the base region is graded from high values at the emitter to low values at the collector has improved alpha-cutoff frequency, low base-lead resistance, and low collector capacitance. Such a device is known as a drift transistor. See for example article by H. Kroemer, "The drift transistor," on page 202 of "Transistors I," published 1956 by RCA Review. However, it has been previously found difficult to fabricate transistors containing a satisfactory graded base from compound semiconductors.

An object of this invention is to provide improved semiconductor devices utilizing compound semiconductors.

Another object of this invention is to provide improved semiconductor devices utilizing III–V compounds.

Still another object of this invention is to provide a new and improved type of transistor.

Yet another object of this invention is to provide an improved type of transistor having an emitter with a higher bandgap than the base region and a graded concentration of impurities in the base region.

These and other objects of the invention are accomplished by immersing a semiconductive compound monocrystalline wafer of one conductivity type in an atmosphere of an impurity material that produces the opposite conductivity type, in a manner such that a thin layer of the opposite type material is formed at a slight depth below the surface of the wafer. This layer makes a P–N junction with the body of the wafer and forms an adjacent drift field due to graded distribution of the impurity and partial compensation of acceptors and donors. The impurity is selected from the group of materials having the ability to combine with a constituent element of the semiconductive compound so as to form a layer of another semiconductive compound at the surface of the wafer, this layer having a higher band-gap than the original wafer. The resulting structure combines the advantages of a graded base drift field with the advantages of a high band-gap emitter, and provides satisfactory transistors from such materials as indium phosphide and gallium arsenide.

The invention and its advantages will be described in greater detail with reference to the accompanying drawing in which Figures 1A, 1B, 1C, 1D, 1E, 1F are cross-sectional schematic views of successive steps in the fabrication of a transistor having the structure and features hereinbefore mentioned;

Figure 2 is a cross-sectional schematic view of a modification of the device shown in Figure 1F.

Similar reference characters are applied to similar elements throughout the drawing.

Referring to Figure 1A of the drawing, a wafer 41 is prepared of a monocrystalline semiconductive compound. In this example the material used is N-type indium phosphide. The size of the wafer is not critical. A suitable wafer may be about 100 mils square and 12 mils thick. The wafer is then heated in a furnace having an atmosphere of an impurity material which produces conductivity of opposite type to that of the wafer. In this example, cadmium is a suitable acceptor for N-type indium phosphide. The temperature and duration of heating the wafer is sufficient to diffuse some impurity material into the surface of the wafer, so as to form a thin layer just below the surface which has opposite conductivity to the bulk of the wafer. The temperature and duration of heating will vary with the particular semiconductive compound and the volatility of the specific impurity material used. In this example, the wafer of N-type indium phosphide is heated in an atmosphere of cadmium vapor for 3 minutes at 800° C.

Referring to Figure 1B of the drawing, the diffusion step forms a thin layer 42 of P-type indium phosphide at a shallow depth below the surfaces of the wafer 41 due to the penetration of cadium molecules which have diffused into the wafer. Between this thin P-type layer 42 and the bulk of the N-type wafer 41 there is formed a P–N junction 43. The layer 42 has a graded concentration of impurity because, as the cadium molecules diffuse into the wafer from the surface, there is a high concentration of cadmium on the wafer surface, which falls off rapidly with increasing depth. The high concentration of cadmium on the surface reacts at the temperature of the furnace with the indium phosphide wafer to form a thin layer of cadmium phosphide 44 extending to the wafer surface. This cadmium phosphide layer 44 is of N-type conductivity. It is believed this is due to the influence of the indium which remains dissolved in it. While indium is an acceptor in germanium, it is a donor in cadmium phosphide. Since the cadmium phosphide surface layer is N-type and the thin graded region just below the surface is P-type, a second P–N junction 45 is formed just beneath the surface of the wafer. The two P–N junctions are thus closely spaced, being separated by the thickness of the graded layer 42.

One broad surface of the wafer is then covered with a resist such as lacquer or polystyrene, and the wafer is then immersed in an etchant. A suitable etchant for the semiconductive III–V compounds is composed of equal volumes of concentrated nitric acid and concentrated hydrochloric acid. The etching step removes the thin P-type indium phosphide layer 42 and the surface layer of cadmium phosphite 44 from all the surfaces of the wafer which were not covered by the resist. The resist is then removed by a suitable solvent, such as toluol for polystyrene, leaving the wafer as shown in Figure 1C.

Referring to Figure 1D, a cadmium dot 46 is alloyed to the cadmium phosphide layer 44. The contact between them is of an ohmic character. An emitter lead 47 is attached to the cadmium dot 46.

Referring to Figure 1E, the wafer is cut or ground at a shallow angle to the surface bearing the cadmium dot 46 so as to expose a greater area of the thin graded layer 42 which serves as the base region. The surface thus exposed is etched to prevent surface leakage across the junctions, then washed in deionized water. An indium dot 48 is next alloyed to the exposed P-type layer 42. The contact between them is of an ohmic character. A base lead 49 is attached to the indium dot 48.

Referring to Figure 1F, a collector tab 50 is alloyed to the N-type indium phosphide portion of the wafer. It may be conveniently placed on the surface opposite the emitter. The collector tab 50 is made of a suitable metal such as nickel, copper, or Kovar. The tab is coated with indium before applying in order to insure an ohmic contact. A collector lead 51 is attached to the collector tab 50, thus completing the transistor.

The resulting structure combines several advantages. First, the two P–N junctions are closely spaced on opposite sides of a thin base region, thus reducing the transit time of charge carriers and improving the characteristics of the device, particularly at high frequencies. Second, the base region has a graded concentration of impurity material which varies from high at the emitter to low at the collector. The decrease in concentration is approximately exponential, thus obtaining the advantages of the drift transistor, which includes low base-lead resistance, low capacitance, and improved alpha-cutoff frequency. Third, the emitter region is made of material with a higher band-gap than the rest of the device, hence the emitter efficiency is improved. Fourth, the device may be simply and inexpensively made in a few steps, since the emitter dot, the collector tab, and the base dot may all be alloyed to the wafer in a single operation.

Figure 2 represents a modification of the device shown in Figure 1F. It is fabricated from the stage shown in Figure 1D. A coating of resist material, such as polystyrene, is applied to the cadmium emitter dot 46 and the emitter lead 47. The unit is then etched again long enough to remove the remainder of the cadmium phosphide layer 44 except for the portion immediately below the emitter dot 45. The unit is removed and washed in deionized water before the diffused base layer 42 is attacked by the etchant. The resist is then removed by a suitable solvent, such as toluol for polystyrene. Thereafter the base connection dot 48 is alloyed to the base layer 42 on the same side of the wafter as the emitter 45. At the same time the collector tab 50 is alloyed to the opposite side of the wafer. The resulting structure has the advantages of a small-area emitter, which includes low emitter capacitance.

It will be appreciated by those skilled in the art that although the examples of the invention have been described in terms of N-type indium phosphide as substrate, it is equally feasible to use the other III–V compounds such as gallium arsenide and indium antimonide.

Some of the III–V compounds as normally made by direct synthesis from the elements are of N-conductivity type, such as gallium arsenide and indium phosphide. Others are normally of P-conductivity type, such as gallium antimonide. It is believed that the particular conductivity type formed depends on slight deviations from strict stoichiometrical proportions in the compounds, as well as the kind and amount of impurities present.

It will be understood that analogous devices can be made beginning with P-type wafers. Applicant has discovered that the N-type III–V compounds can be doped with zinc, cadmium, or mercury to become P-type, while the P-type materials of this group can be doped with selenium, sulfur or tellurium to become N-type.

An advantage in utilization at high temperatures accrues because this invention enables the successful use of compound semiconductors to fabricate improved transistors. Devices of this class which are made of germanium cannot operate at high temperatures. This temperature limitation is primarily a function of the energy gap or forbidden region between the valence band and the conduction band of the semiconductive material employed. When the temperature of a device of this class reaches a point where the thermal energy is sufficient to raise substantial numbers of electrons across the energy gap, the electrical characteristics of the semiconductive material are adversely affected. For example, the energy gap of germanium is about 0.7 electron volt, and most germanium semiconductive devices become inoperative above 80° C. This is a severe limitation for many applications. To overcome this, semiconductive materials with a larger energy gap are used, for example silicon with an energy gap of about 1.1 electron volts, since silicon devices can be successfully operated at higher ambient or dissipation temperatures. If the energy gap of a semiconductor is too large, the material becomes similar to an insulator in its properties, and is useless for devices such as transistors. Some of the III–V compounds mentioned above have the advantages of an energy gap which are higher than that of germanium or silicon, but is still within the range of usefulness as a semiconductor. A representative compound semiconductor such as gallium arsenide has an energy gap of 1.35 electron volts. Hence a device employing semiconductive gallium arsenide can be operated at temperatures estimated to be as high as at least 300° C. The estimated magnitude of the energy gap in some of the other semiconductive compounds mentioned follows: indium phosphide, 1.25 electron volts; aluminum antimonide, 1.6 electron volts; gallium phosphide, 2.4 electron volts; aluminum arsenide, 2.4 electron volts.

The primary properties of a pure semiconductor are determined not only by the width of the forbidden energy gap between the valence and conduction bands, but also by the mobility of the charge carriers in the material. High mobility is particularly desirable for the minority charge carriers in devices such as transistors. The mobility of negative charge carriers (electrons) in germanium is about 3900 $cm.^2$/volt sec. The mobility of electrons in silicon is smaller, being about 1900 $cm.^2$/volt sec. Some of the III–V compounds mentioned have considerably higher mobilities. For example, the mobility of electrons in gallium arsenide is 4000 $cm.^2$/volt sec.; in indium arsenide, about 23,000 $cm.^2$/volt sec.; in indium antimonide, about 65,000 $cm.^2$/volt sec. Indium phosphide, which has been described in detail as a representative member of the compound semiconductors, has an electron mobility of over 3400 $cm.^2$/volt sec., and unites the advantages of germanium (high mobility of charge carriers) with the advantages of silicon (large energy gap). Semiconductors with high electron mobility are particularly suitable for NPN devices of the type shown in this invention.

There thus have been described new and useful forms of semiconductor devices as well as methods for making these devices.

What is claimed is:

1. A transistor comprising a substrate of n-type gallium arsenide as collector, a base region of gallium arsenide containing cadmium so as to be p-type, and an emitter consisting of a cadmium arsenide layer on said base region.

2. A transistor comprising a substrate of n-type indium phosphide as collector, a base region of indium phosphide containing zinc so as to be p-type, and an emitter consisting of a zinc phosphide layer on the said base region.

3. A transistor comprising a substrate of p-type gallium arsenide as collector, a base region of gallium arsenide diffused with tellurium so as to become n-type, and an emitter consisting of a gallium telluride layer on the said base region.

4. A transistor comprising a substrate of p-type indium phosphide as collector, a base region of indium phosphide diffused with selenium so as to become n-type, and an emitter consisting of an indium selenide layer on the said base region.

5. A transistor comprising a substrate of p-type indium phosphide as collector, a base region of indium phosphide diffused with sulfur so as to become n-type, and an emitter consisting of an indium sulfide layer on the said base region.

6. A semiconductor device including a body having a first region of a semiconductor material of one conductivity type, said material consisting essentially of a compound of one element of the group consisting of aluminum, gallium and indium and another element of the group consisting of arsenic, antimony and phosphorus, a second region of said compound body of conductivity type opposite to said one conductivity type in rectifying contact with said first region, said opposite conductivity being due to impurity atoms of another element dispersed in said second region of said device, and a third region of said one conductivity type in rectifying contact with said second region, said third region being a compound semiconductor including said impurity and one of the constituents of said first mentioned semiconductor compound.

7. A transistor device comprising a first region of one conductivity type and including a semiconductive compound having atoms of an impurity element dispersed therein which produce said conductivity type, said compound consisting essentially of a compound of one element of the group consisting of aluminum, gallium and indium and another element of the group consisting of arsenic, antimony and phosphorus, and a second region in rectifying contact with said first region, said second region comprising another semiconductive compound composed of said impurity element and one of the constituents of said first mentioned semiconductor compound.

8. A transistor device comprising one semiconductive compound substrate as collector, said substrate consisting essentially of a compound of one element of the group consisting of aluminum, gallium and indium and another element of the group consisting of arsenic, antimony and phosphorus, a base region in which the concentration of type-determining impurity material varies from high at the emitter to low at the collector, and an emitter including another semiconductive compound formed by one of the constituents of said substrate and the conductivity type-determining impurity material used in said base region.

9. A transistor device comprising one semiconductive compound substrate as collector, said substrate consisting essentially of a compound of one element of the group consisting of aluminum, gallium and indium and another element of the group consisting of arsenic, antimony and phosphorus, a base region having a concentration of conductivity type-determining impurity material varying from high at the emitter to low at the collector, and an emitter including another semiconductive compound which has a higher bandgap than that of the base region, said emitter compound being formed by one of the constituents of said substrate and the type-determining impurity material used in said base region.

10. A semiconductor transistor device comprising a semiconductive compound substrate of one conductivity type as collector, said substrate consisting essentially of a compound of one element of the group consisting of aluminum, gallium and indium and another element of the group consisting of arsenic, antimony and phosphorus, an adjacent base region containing an impurity material in the opposite conductivity-forming type, and an emitter region of said one conductivity type adjacent to said base region, said emitter being formed by one of the constituents of said substrate and said impurity material.

References Cited in the file of this patent

UNITED STATES PATENTS 2,759,861 Collins et al. ____________ Aug. 21, 1956

FOREIGN PATENTS 707,008 Great Britain ____________ Apr. 7, 1954